(12) United States Patent
Han et al.

(10) Patent No.: US 11,710,654 B2
(45) Date of Patent: Jul. 25, 2023

(54) SUBSTRATE TRANSPORT APPARATUS, SUBSTRATE PROCESSING APPARATUS, AND SUBSTRATE TRANSPORT METHOD

(71) Applicant: SEMES CO., LTD., Cheonan-si (KR)

(72) Inventors: Ki Won Han, Anseong-si (KR); Byoung Doo Choi, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 17/398,422

(22) Filed: Aug. 10, 2021

(65) Prior Publication Data

US 2022/0051926 A1 Feb. 17, 2022

(30) Foreign Application Priority Data

Aug. 13, 2020 (KR) .................. 10-2020-0101983

(51) Int. Cl.
| | | |
|---|---|---|
| *H01L 21/677* | (2006.01) | |
| *H01L 21/683* | (2006.01) | |
| *G03F 7/00* | (2006.01) | |
| *G03F 7/16* | (2006.01) | |
| *H01L 21/687* | (2006.01) | |

(52) U.S. Cl.
CPC .......... *H01L 21/6838* (2013.01); *G03F 7/162* (2013.01); *G03F 7/70733* (2013.01); *H01L 21/67751* (2013.01); *H01L 21/68742* (2013.01)

(58) Field of Classification Search
CPC ...... G03F 7/162; G03F 7/168; G03F 7/70733; G03F 7/2028; H01L 21/67178; H01L 21/67742; H01L 21/67748; H01L 21/67751; H01L 21/6838; H01L 21/68707; H01L 21/68742; H01L 21/67161; H01L 21/67184; H01L 21/67706

See application file for complete search history.

(56) References Cited

FOREIGN PATENT DOCUMENTS

| | | | |
|---|---|---|---|
| JP | H11330189 A | 11/1999 | |
| JP | 2004-071730 A | 3/2004 | |
| JP | 2004319761 A | * 11/2004 | ....... H01L 21/67017 |
| JP | 2012-224024 A | 11/2012 | |
| JP | 2013-105959 A | 5/2013 | |
| JP | 2016-025168 A | 2/2016 | |
| JP | 2017-092309 A | 5/2017 | |

(Continued)

OTHER PUBLICATIONS

Google translation of JP 2017-092309, May 2017.*

(Continued)

*Primary Examiner* — Peter B Kim

(74) *Attorney, Agent, or Firm* — Harness, Dickey & Pierce, P.L.C.

(57) ABSTRACT

A substrate transport apparatus includes transport hands that clamp substrates by vacuum pressures, respectively, and that are located at different heights, a vacuum pressure supply unit that supplies the vacuum pressures to the transport hands, and a controller that controls the vacuum pressure supply unit to supply the vacuum pressures to the transport hands or interrupt the supply of the vacuum pressures to the transport hands. The controller controls the vacuum pressure supply unit such that the vacuum pressures of the transport hands are turned off at the same height from a substrate support member.

9 Claims, 10 Drawing Sheets

(56) References Cited

FOREIGN PATENT DOCUMENTS

| | | | |
|---|---|---|---|
| JP | 2017-139268 | A | 8/2017 |
| JP | 2018-137383 | A | 8/2018 |
| KR | 10-0553685 | | 2/2006 |
| KR | 20090070521 | A * | 7/2009 |
| KR | 10-1400453 | | 5/2014 |
| KR | 10-2018-0099726 | A | 9/2018 |
| KR | 10-2156896 | | 9/2020 |

OTHER PUBLICATIONS

Google translation of JP 2016-025168, Feb. 2016.*
Japanese Office Action dated Sep. 20, 2022 issued in corresponding Japanese Appln. No. 2021-131337.

* cited by examiner

SUBSTRATE TRANSPORT APPARATUS, SUBSTRATE PROCESSING APPARATUS, AND SUBSTRATE TRANSPORT METHOD

CROSS-REFERENCE TO RELATED APPLICATIONS

A claim for priority under 35 U.S.C. § 119 is made to Korean Patent Application No. 10-2020-0101983 filed on Aug. 13, 2020, in the Korean Intellectual Property Office, the entire contents of which are hereby incorporated by reference.

BACKGROUND

Embodiments of the inventive concept described herein relate to a substrate processing apparatus, and more particularly, relate to a substrate transport apparatus, a substrate processing apparatus, and a substrate transport method for improving accuracy in seating a substrate.

In a semiconductor manufacturing process, a photolithography process is a process of forming a desired resist pattern by coating a substrate with photoresist, exposing the photoresist on the substrate to light using a photo-mask, and developing the photoresist on the substrate. The photolithography process includes a resist coating process, an exposure process, and a developing process. A substrate transport apparatus transports a substrate to processing units (or process chambers) that perform the respective processes. Accordingly, the substrate transport apparatus requires precision control of a transport robot to accurately supply the substrate to the processing units.

For example, semiconductor manufacturing equipment, such as a spinner system or a scrubber, has a plurality of processing units, and a transport robot transports a substrate to the processing units. The processing units perform respective processes on the substrate, and the substrate is transported to the outside by the transport robot. In this case, to load the substrate to an accurate position on a plate or a spin chuck in each of the processing units, a teaching operation of adjusting the transport robot is performed before a process is performed in the processing unit.

Especially, in an edge bead removal (EBR) process for removing an edge portion of a photoresist film or pattern, it is very important to load a substrate to an accurate position on a spin chuck.

However, the position of the substrate may be misaligned in the process in which a hand of a transport robot lowers the substrate onto the spin chuck. The transport robot lowers the substrate onto the spin chuck by moving the hand downward after turning off vacuum pressure of the hand. Therefore, the position of the substrate may be misaligned by inertia when the hand moves downward, and accuracy in seating the substrate may be lowered.

Particularly, when a low hand and a high hand of a transport robot transport substrates, there may be a difference in downward movement between the low hand and the high hand, and accuracy in seating the substrates may be lowered with an increase in distances by which the low hand and the high hand move downward.

SUMMARY

Embodiments of the inventive concept provide a substrate transport apparatus, a substrate processing apparatus, and a substrate transport method for improving accuracy in seating a substrate.

Embodiments of the inventive concept provide a substrate transport apparatus, a substrate processing apparatus, and a substrate transport method for achieving an increase in substrate transport speed.

The technical problems to be solved by the inventive concept are not limited to the aforementioned problems, and any other technical problems not mentioned herein will be clearly understood from the following description by those skilled in the art to which the inventive concept pertains.

According to an embodiment, a substrate transport apparatus includes a transport hand that clamps a substrate by vacuum pressure, a vacuum pressure supply unit that supplies the vacuum pressure to the transport hand, and a controller that controls the vacuum pressure supply unit to supply the vacuum pressure to the transport hand or interrupt the supply of the vacuum pressure to the transport hand. The controller interrupts the supply of the vacuum pressure while the transport hand moves downward to load the substrate onto a substrate support member in a state of being located over the substrate support member.

The vacuum pressure supply unit may include a vacuum pressure line and an opening/shutting valve disposed in-line with the vacuum pressure line and operated by a control signal of the controller.

A time point when the controller interrupts the supply of the vacuum pressure may exceed delay time in operation of the opening/shutting valve based on when the substrate is placed on the substrate support member.

According to an embodiment, a substrate transport apparatus includes transport hands that clamp substrates by vacuum pressures, respectively, and that are located at different heights, a vacuum pressure supply unit that supplies the vacuum pressures to the transport hands, and a controller that controls the vacuum pressure supply unit to supply the vacuum pressures to the transport hands or interrupt the supply of the vacuum pressures to the transport hands. The controller controls the vacuum pressure supply unit such that the vacuum pressures of the transport hands are turned off at the same height from a substrate support member.

Distances by which the transport hands move after the vacuum pressures are turned off may be equal to each other.

The vacuum pressure supply unit may include vacuum pressure lines and opening/shutting valves disposed in-line with the vacuum pressure lines and operated by control signals of the controller.

Periods of time during which the transport hands move downward after the vacuum pressures are turned off may exceed delay time in operation of the opening/shutting valves based on when the substrates are placed on the substrate support member.

According to an embodiment, a substrate processing apparatus includes a process chamber having a substrate support member on which a substrate is placed and a substrate transport apparatus that loads the substrate onto the substrate support member. The substrate transport apparatus includes transport hands that clamp substrates by vacuum pressures, respectively, and that are located at different heights, and the vacuum pressures of the transport hands are turned off at the same height from the substrate support member.

The substrate transport apparatus may further include a vacuum pressure supply unit that supplies the vacuum pressures to the transport hands and a controller that controls the vacuum pressure supply unit to supply the vacuum pressures to the transport hands or interrupt the supply of the vacuum pressures to the transport hands. The controller may control the vacuum pressure supply unit such that the vacuum pressures of the transport hands are turned off at a height where distances by which the transport hands move downward after the vacuum pressures are turned off are equal to each other.

The vacuum pressure supply unit may include opening/shutting valves that are disposed in-line with vacuum pressure lines connected to the transport hands and that are operated by control signals of the controller, and periods of time during which the transport hands move downward after the vacuum pressures are turned off may exceed delay time in operation of the opening/shutting valves based on when the substrates are placed on the substrate support member.

An edge bead removal (EBR) process may be performed in the process chamber.

An edge exposure of wafer (EEW) process may be performed in the process chamber.

The substrate support member may include a spin chuck and a lift pin that receives the substrate from each of the transport hands and lowers the substrate onto the spin chuck.

According to an embodiment, provided is a substrate transport method in which in a step in which a transport hand that supports a substrate by vacuum pressure moves downward to load the substrate onto a substrate support member, the vacuum pressure by which the transport hand clamps the substrate is turned off during the downward movement of the transport hand before the substrate is placed on the substrate support member.

In the step in which the transport hand moves downward, time to turn off the vacuum pressure may exceed delay time in operation of an opening/shutting valve that interrupts the vacuum pressure, based on when the substrate is placed on the substrate support member.

According to an embodiment, provided is a substrate transport method in which in a step in which transport hands located at different heights move downward to load substrates onto a substrate support member, vacuum pressures by which the transport hands clamp the substrates are turned off at the same height from the substrate support member such that distances by which the transport hands move downward after the vacuum pressures are turned off are equal to each other.

Time to turn off the vacuum pressures may exceed delay time in operation of opening/shutting valves that interrupt the vacuum pressures, based on when the substrates are placed on the substrate support member.

According to an embodiment, a substrate transport method includes transporting substrates by a substrate transport apparatus including a first transport hand and a second transport hand located at different heights. The first transport hand clamps a first substrate by vacuum pressure and transports the first substrate to a substrate support member of a process chamber, and the second transport hand clamps a second substrate by vacuum pressure and transports the second substrate to the substrate support member. The vacuum pressure of the first transport hand is turned off at a first height from the substrate support member when the first transport hand moves downward from directly above the substrate support member to load the first substrate onto the substrate support member. The vacuum pressure of the second transport hand is turned off at a second height from the substrate support member when the second transport hand moves downward from directly above the substrate support member to load the second substrate onto the substrate support member, and the first height and the second height are equal to each other.

The substrate support member may include a spin chuck and a lift pin that receives the first substrate or the second substrate from the first transport hand or the second transport hand and lowers the first substrate or the second substrate onto the spin chuck. The first height and the second height may be heights from an upper end of the lift pin protruding from the spin chuck.

An edge bead removal (EBR) process or an edge exposure of wafer (EEW) process may be performed in the process chamber.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
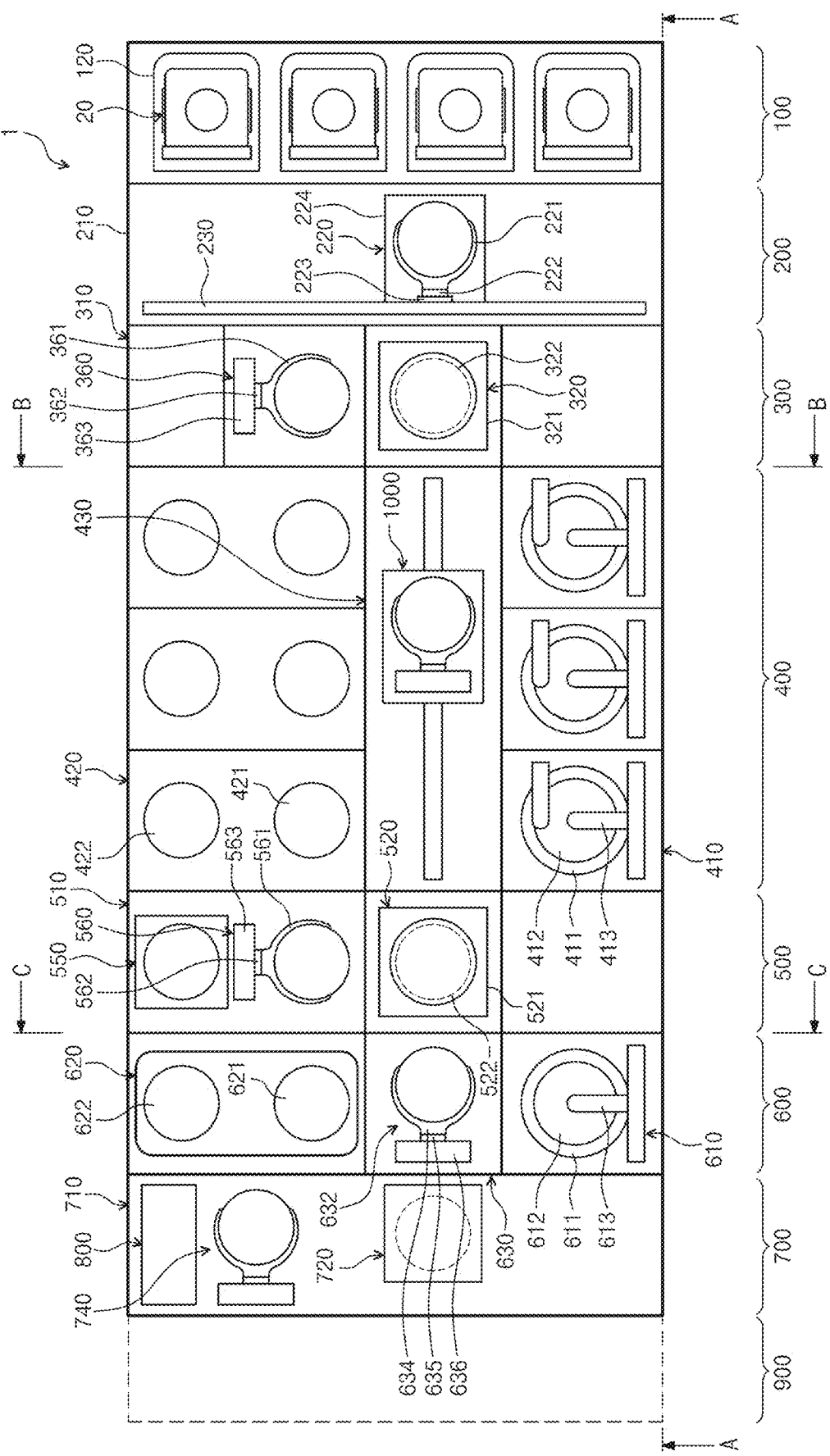
FIG. 1 is a view of substrate processing equipment as viewed from above.

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that the inventive concept will be thorough and complete, and will fully convey the scope of the inventive concept to those skilled in the art. In the drawings, the dimensions of components are exaggerated or reduced for clarity of illustration.

Substrate processing equipment of the inventive concept may be used to perform a photolithography process on a substrate such as a semiconductor wafer or a flat display panel. In particular, the substrate processing equipment of the inventive concept may be connected to an exposure apparatus and may be used to perform a coating process and a developing process on a substrate. In the following description, it will be exemplified that a wafer is used as a substrate.

Figure 2:
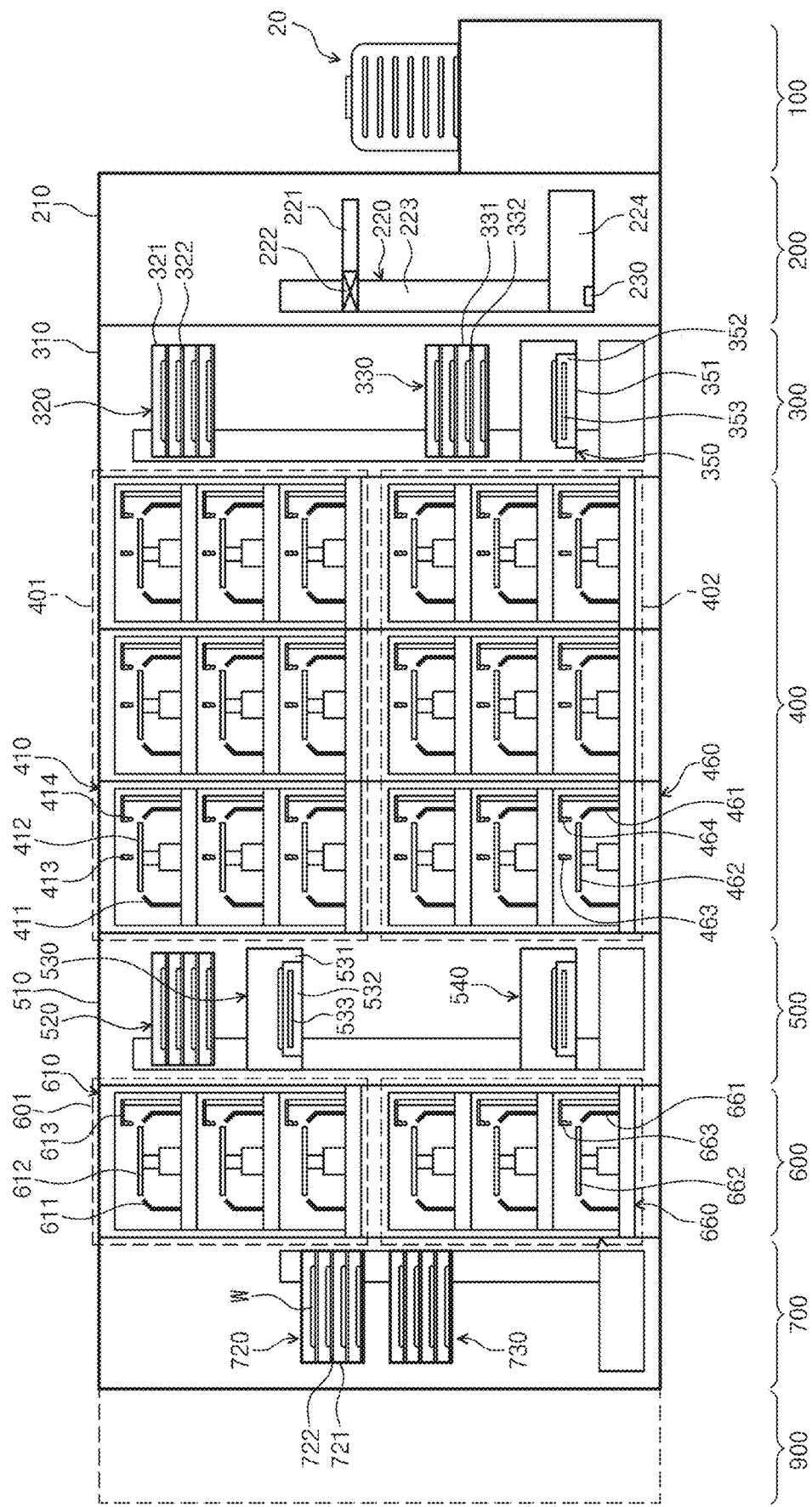
FIG. 2 is a view illustrating the substrate processing equipment of FIG. 1 when viewed in direction A-A.
Figure 3:
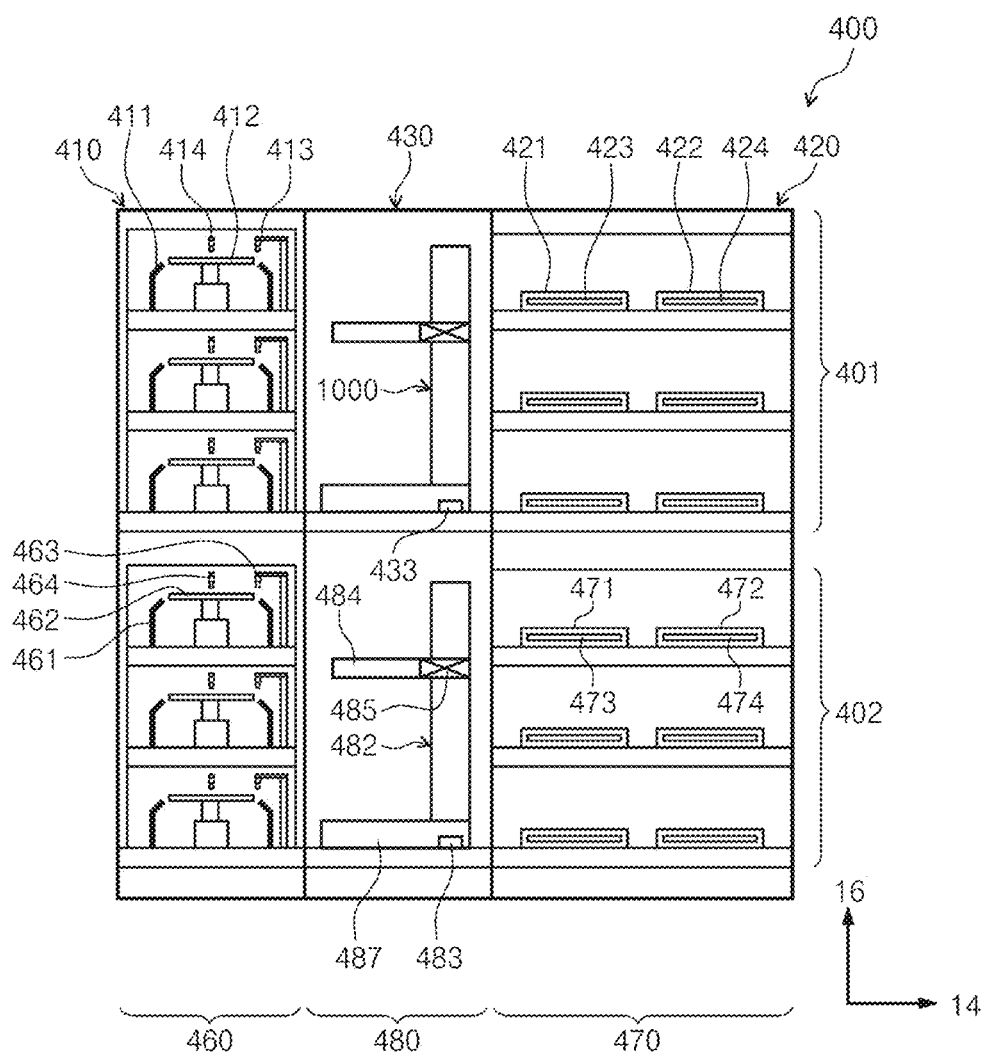
FIG. 3 is a view illustrating the substrate processing equipment of FIG. 1 when viewed in direction B-B.
Figure 4:
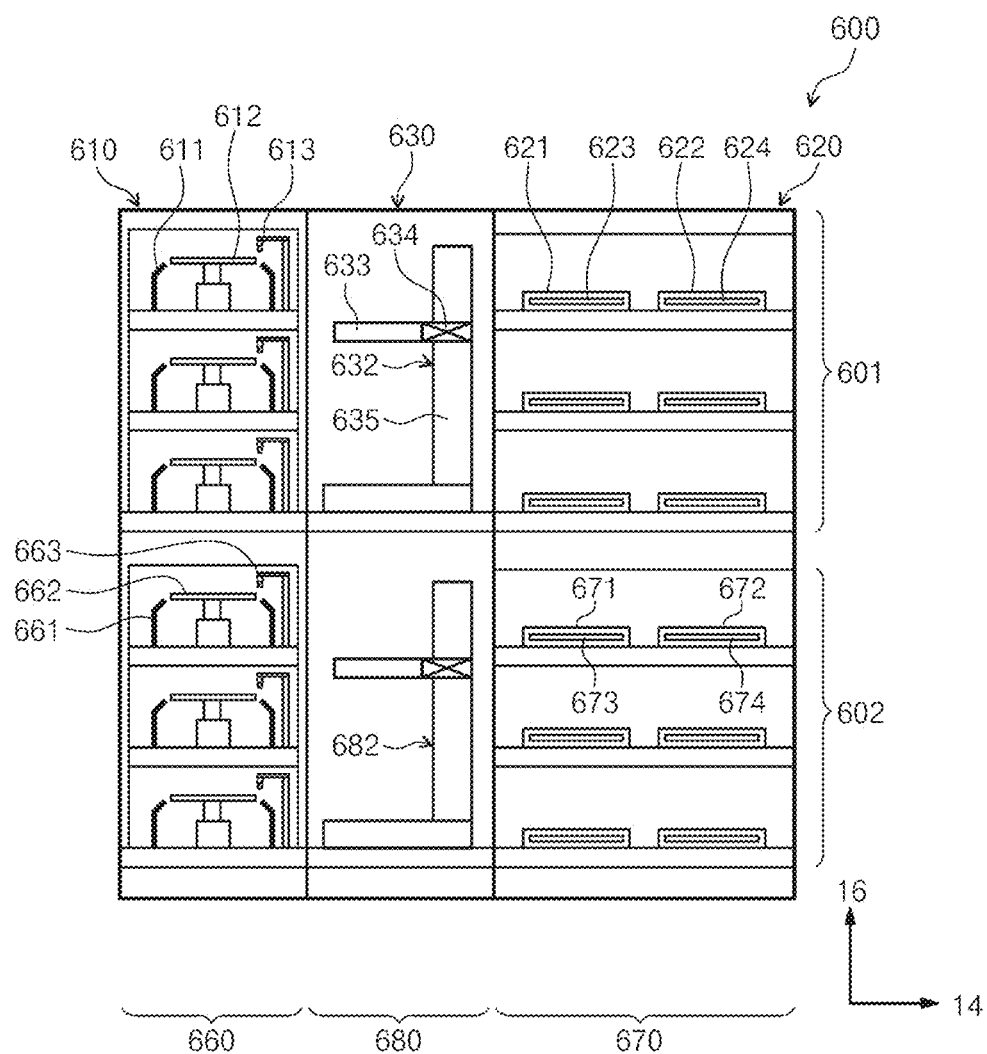
FIG. 4 is a view illustrating the substrate processing equipment of FIG. 1 when viewed in direction C-C.

FIGS. 1 to 4 are schematic views illustrating substrate processing equipment 1 according to an embodiment of the inventive concept. FIG. 1 is a view of the substrate processing equipment as viewed from above. FIG. 2 is a view illustrating the substrate processing equipment of FIG. 1 when viewed in direction A-A. FIG. 3 is a view illustrating the substrate processing equipment of FIG. 1 when viewed in direction B-B. FIG. 4 is a view illustrating the substrate processing equipment of FIG. 1 when viewed in direction C-C.

Referring to FIGS. 1 to 4, the substrate processing equipment 1 may include a load port 100, an index module 200, a first buffer module 300, a coating and developing module 400, a second buffer module 500, a pre/post-exposure process module 600, and an interface module 700. The load port 100, the index module 200, the first buffer module 300, the coating and developing module 400, the second buffer module 500, the pre/post-exposure process module 600, and the interface module 700 are sequentially disposed in a row in one direction.

Hereinafter, a direction in which the load port 100, the index module 200, the first buffer module 300, the coating and developing module 400, the second buffer module 500, the pre/post-exposure process module 600, and the interface module 700 are disposed is referred to as a first direction 12. A direction perpendicular to the first direction 12 when viewed from above is referred to as a second direction 14, and a direction perpendicular to the first direction 12 and the second direction 14 is referred to as a third direction 16.

Substrates W are moved in a state of being received in a cassette 20. The cassette 20 has a structure that can be sealed from the outside. For example, a front open unified pod (FOUP) having a door at the front may be used as the cassette 20.

Hereinafter, the load port 100, the index module 200, the first buffer module 300, the coating and developing module 400, the second buffer module 500, the pre/post-exposure process module 600, and the interface module 700 will be described in detail.

The load port 100 has a mounting table 120 on which the cassette 20 having the substrates W received therein is placed. A plurality of mounting tables 120 may be provided. The mounting tables 200 may be disposed in a row along the second direction 14. In FIG. 1, four mounting tables 120 are provided.

The index module 200 transfers the substrates W between the cassette 20 placed on the mounting table 120 of the load port 100 and the first buffer module 300. The index module 200 has a frame 210, an index robot 220, and a guide rail 230. The frame 210 has a substantially rectangular parallelepiped shape with an empty space inside and is disposed between the load port 100 and the first buffer module 300. The frame 210 of the index module 200 may be provided in a lower position than a frame 310 of the first buffer module 300 that will be described below. The index robot 220 and the guide rail 230 are disposed in the frame 210. The index robot 220 has a structure capable of 4-axis driving such that a hand 221 for directly handling the substrate W is movable in the first direction 12, the second direction 14, and the third direction 16 and is rotatable about the central axis thereof. The index robot 220 has the hand 221, an arm 222, a support rod 223, and a base 224. The hand 221 is fixedly attached to the arm 222. The arm 222 has a retractable and rotatable structure. The support rod 223 is disposed such that the lengthwise direction thereof is parallel to the third direction 16. The arm 222 is coupled to the support rod 223 so as to be movable along the support rod 223. The support rod 223 is fixedly coupled to the base 224. The guide rail 230 is disposed such that the lengthwise direction thereof is parallel to the second direction 14. The base 224 is coupled to the guide rail 230 so as to be linearly movable along the guide rail 230. Furthermore, although not illustrated, a door opener for opening and closing the door of the cassette 20 is additionally provided in the frame 210.

The first buffer module 300 has the frame 310, a first buffer 320, a second buffer 330, a cooling chamber 350, and a first buffer robot 360. The frame 310 has a rectangular parallelepiped shape with an empty space inside and is disposed between the index module 200 and the coating and developing module 400. The first buffer 320, the second buffer 330, the cooling chamber 350, and the first buffer robot 360 are located in the frame 310. The cooling chamber 350, the second buffer 330, and the first buffer 320 are sequentially disposed upward along the third direction 16. The first buffer 320 is located at the height corresponding to a coating module 401 of the coating and developing module 400 that will be described below, and the second buffer 330 and the cooling chamber 350 are located at the heights corresponding to a developing module 402 of the coating and developing module 400 that will be described below. The first buffer robot 360 is located to be spaced apart from the second buffer 330, the cooling chamber 350, and the first buffer 320 by a predetermined distance in the second direction 14.

Each of the first buffer 320 and the second buffer 330 temporarily stores a plurality of substrates W. The second buffer 330 has a housing 331 and a plurality of supports 332. The supports 332 are disposed in the housing 331 and are spaced apart from each other along the third direction 16. One substrate W is placed on each of the supports 332. The housing 331 has openings (not illustrated) that face toward the index robot 220, the first buffer robot 360, and a developer robot 482, such that the index robot 220, the first buffer robot 360, and the developer robot 482 of the developing module 402, which will be described below, load the substrates W onto the supports 332 or unload the substrates W from the supports 332. The first buffer 320 has a structure substantially similar to that of the second buffer 330. However, a housing 321 of the first buffer 320 has openings that face toward the first buffer robot 360 and a coater robot 432 of the coating module 401 that will be described below. The number of supports 322 provided in the first buffer 320 may be the same as, or different from, the number of supports 332 provided in the second buffer 330. According to an embodiment, the number of supports 332 provided in the second buffer 330 may be larger than the number of supports 322 provided in the first buffer 320.

The first buffer robot 360 transfers the substrates W between the first buffer 320 and the second buffer 330. The first buffer robot 360 has a hand 361, an arm 362, and a support rod 363. The hand 361 is fixedly attached to the arm 362. The arm 362 has a retractable structure and enables the hand 361 to move along the second direction 14. The arm 362 is coupled to the support rod 363 so as to be linearly movable along the support rod 363 in the third direction 16. The support rod 363 has a length extending from the position corresponding to the second buffer 330 to the position corresponding to the first buffer 320. The support rod 363 may further extend upward or downward. The first buffer robot 360 may be provided such that the hand 361 simply performs only 2-axis driving along the second direction 14 and the third direction 16.

The cooling chamber 350 cools the substrate W. The cooling chamber 350 has a housing 351 and a cooling plate 352. The cooling plate 352 has a cooling means 353 that cools the substrate W placed on an upper surface of the cooling plate 352. Various methods, such as cooling by cooling water, cooling by a thermoelectric element, and the like, may be used for the cooling means 353. Furthermore, the cooling chamber 350 may include a lift pin assembly (not illustrated) that locates the substrate W on the cooling plate 352. The housing 351 has openings (not illustrated) that face toward the index robot 220 and the developer robot 482, such that the index robot 220 and the developer robot 482 provided in the developing module 402 load the substrate W onto the cooling plate 352 or unload the substrate W from the cooling plate 352. In addition, the cooling chamber 350 may include doors (not illustrated) that open and close the openings described above.

The coating and developing module 400 performs a process of coating the substrate W with photoresist before an exposure process and performs a developing process on the substrate W after the exposure process. The coating and developing module 400 has a substantially rectangular parallelepiped shape. The coating and developing module 400 has the coating module 401 and the developing module 402. The coating module 401 and the developing module 402 are disposed on different floors so as to be divided from each other. According to an embodiment, the coating module 401 is located over the developing module 402.

The coating module 401 may perform a process of coating the substrate W with a light-sensitive material such as photoresist, a heat treatment process of heating and cooling the substrate W before and after the photoresist coating process, and an edge bead removal process.

The coating module 401 has coating chambers 410, bake chambers 420, and a transfer chamber 430. The coating chambers 410, the bake chambers 420, and the transfer chamber 430 are sequentially disposed along the second direction 14. Accordingly, the coating chambers 410 and the bake chambers 420 are located to be spaced apart from each other in the second direction 14, with the transfer chamber 430 therebetween. The coating chambers 410 are provided in the first direction 12 and the third direction 16. The drawings illustrate an example that six coating chambers 410 are provided. The bake chambers 420 are provided in the first direction 12 and the third direction 16. The drawings illustrate an example that six bake chambers 420 are provided. However, a larger number of bake chambers 420 may be provided.

A substrate transport apparatus 1000 for transporting a substrate is provided in the transfer chamber 430.

The substrate transport apparatus 1000 transports the substrates W between the bake chambers 420, the coating chambers 410, the first buffer 320 of the first buffer module 300, and a first buffer 520 of the second buffer module 500 that will be described below.

The coating chambers 410 all have the same structure. However, the types of photoresists used in the respective coating chambers 410 may differ from one another. For example, chemical amplification resist may be used as photoresist. Each of the coating chambers 410 coats the substrate W with photoresist.

The coating chamber 410 has a housing 411, a support plate 412 (a spin head), and a nozzle 413. The housing 411 has a cup shape with an open top. The support plate 412 is located in the housing 411 and supports the substrate W. The support plate 412 is provided so as to be rotatable. The nozzle 413 dispenses photoresist onto the substrate W placed on the support plate 412. The nozzle 413 may have a circular tubular shape and may dispense the photoresist onto the center of the substrate W. Selectively, the nozzle 413 may have a length corresponding to the diameter of the substrate W, and a dispensing opening of the nozzle 413 may have a slit shape. Additionally, the coating chamber 410 may further include a nozzle 414 for dispensing a cleaning solution such as deionized water to clean the surface of the substrate W having the photoresist applied thereto.

An edge bead removal process may be performed in the coating chamber 410. However, without being limited thereto, a separate chamber for performing only an edge bead removal process may be provided.

Referring again to FIGS. 1 to 4, each of the bake chambers 420 performs heat treatment on the substrate W. For example, the bake chamber 420 performs a prebake process of removing organics or moisture on the surface of the substrate W by heating the substrate W to a predetermined temperature before coating the substrate W with photoresist, or performs a soft bake process after coating the substrate W with the photoresist. In addition, the bake chamber 420 performs a cooling process of cooling the substrate W after the heating processes. The bake chamber 420 has a cooling plate 421 or a heating plate 422. The cooling plate 421 includes a cooling means 423 such as cooling water or a thermoelectric element. Furthermore, the heating plate 422 includes a heating means 424 such as a heating wire or a thermoelectric element. The cooling plate 421 and the heating plate 422 may each be provided in one bake chamber 420. Selectively, some of the bake chambers 420 may include only the cooling plate 421, and the other bake chambers 420 may include only the heating plate 422.

The developing module 402 performs a developing process of removing part of photoresist by dispensing a developing solution to obtain patterns on the substrate W and a heat treatment process of heating and cooling the substrate W before or after the developing process. The developing module 402 has developing chambers 460, bake chambers 470, and a transfer chamber 480. The developing chambers 460, the bake chambers 470, and the transfer chamber 480 are sequentially disposed along the second direction 14. Accordingly, the developing chambers 460 and the bake chambers 470 are located to be spaced apart from each other in the second direction 12, with the transfer chamber 480 therebetween. The developing chambers 460 are provided in the first direction 12 and the third direction 16. The drawings illustrate an example that six developing chambers 460 are provided. The bake chambers 470 are provided in the first direction 12 and the third direction 16. The drawings illustrate an example that six bake chambers 470 are provided. However, a larger number of bake chambers 470 may be provided.

The developer robot 482 for transferring the substrate W is provided in the transfer chamber 380. The developer robot 482 transfers the substrates W between the bake chambers 470, the developing chambers 460, the second buffer 330 and the cooling chamber 350 of the first buffer module 300, and a second cooling chamber 540 of the second buffer module 500. The developer robot 482 of the developing module 402 is located under the substrate transport apparatus 1000 of the coating module 401.

The developing chambers 460 all have the same structure. However, the types of developing solutions used in the respective developing chambers 460 may differ from one another. Each of the developing chambers 460 removes a light-exposed area of photoresist on the substrates W. At this time, a light-exposed area of a protective film is removed together. Selectively, depending on the type of photoresist used, only masked areas of the photoresist and the protective film may be removed.

The developing chamber 460 has a housing 461, a support plate 462, and a nozzle 463. The housing 461 has a cup shape with an open top. The support plate 462 is located in the housing 461 and supports the substrate W. The support plate 462 is provided so as to be rotatable. The nozzle 463 dispenses a developing solution onto the substrate W placed on the support plate 462. The nozzle 463 may have a circular tubular shape and may dispense the developing solution onto the center of the substrate W. Selectively, the nozzle 463 may have a length corresponding to the diameter of the substrate W, and a dispensing opening of the nozzle 463 may have a slit shape. Additionally, the developing chamber 460 may further include a nozzle 464 for dispensing a cleaning solution such as deionized water to clean the surface of the substrate W onto which the developing solution is dispensed.

Each of the bake chambers 470 performs heat treatment on the substrate W. For example, the bake chamber 470 performs a post bake process of heating the substrate W before the developing process is performed, a hard bake process of heating the substrate W after the developing process is performed, and a cooling process of cooling the substrate W after the bake processes. The bake chamber 470 has a cooling plate 471 or a heating plate 472. The cooling plate 471 includes a cooling means 473 such as cooling water or a thermoelectric element. Furthermore, the heating plate 472 includes a heating means 474 such as a heating wire or a thermoelectric element. The cooling plate 471 and the heating plate 472 may each be provided in one bake chamber 470. Selectively, some of the bake chambers 470 may include only the cooling plate 471, and the other bake chambers 470 may include only the heating plate 472.

As described above, the coating module 401 and the developing module 402 are separated from each other in the coating and developing module 400. Furthermore, when viewed from above, the coating module 401 and the developing module 402 may have the same chamber arrangement.

The second buffer module 500 serves as a passage through which the substrate W is carried between the coating and developing module 400 and the pre/post-exposure process module 600. In addition, the second buffer module 500 performs a predetermined process, such as a cooling process or an edge exposure process, on the substrate W. The second buffer module 500 has a frame 510, the buffer 520, a first cooling chamber 530, the second cooling chamber 540, an edge exposure chamber 550, and a second buffer robot 560. The frame 510 has a rectangular parallelepiped shape. The buffer 520, the first cooling chamber 530, the second cooling chamber 540, the edge exposure chamber 550, and the second buffer robot 560 are located in the frame 510. The buffer 520, the first cooling chamber 530, and the edge exposure chamber 550 are disposed at the heights corresponding to the coating module 401. The second cooling chamber 540 is disposed at the height corresponding to the developing module 402. The buffer 520, the first cooling chamber 530, and the second cooling chamber 540 are sequentially disposed in a row along the third direction 16. When viewed from above, the buffer 520 is disposed side by side with the transfer chamber 430 of the coating module 401 along the first direction 12. The edge exposure chamber 550 is disposed to be spaced apart from the buffer 520 or the first cooling chamber 530 by a predetermined distance in the second direction 14.

The second buffer robot 560 carries the substrate W between the buffer 520, the first cooling chamber 530, and the edge exposure chamber 550. The second buffer robot 560 is located between the edge exposure chamber 550 and the buffer 520. The second buffer robot 560 may have a structure similar to the structure of the first buffer robot 360. The first cooling chamber 530 and the edge exposure chamber 550 perform subsequent processes on the substrate W processed in the coating module 401. The first cooling chamber 530 cools the substrate W processed in the coating module 401. The first cooling chamber 530 has a structure similar to that of the cooling chamber 350 of the first buffer module 300. The edge exposure chamber 550 performs an exposure process on the edge of the substrate W subjected to the cooling process in the first cooling chamber 530. The buffer 520 temporarily stores the substrate W before the substrate W processed in the edge exposure chamber 550 is transferred to a pre-processing module 601 that will be described below. The second cooling chamber 540 cools the substrate W before the substrate W processed in a post-processing module 602, which will be described below, is transferred to the developing module 402. The second buffer module 500 may further include an additional buffer at the height corresponding to the developing module 402. In this case, the substrate W processed in the post-processing module 602 may be transferred to the developing module 402 after temporarily stored in the additional buffer.

In a case where an exposure apparatus 900 performs a liquid immersion lithography process, the pre/post-exposure process module 600 may perform a process of coating a protective film that protects a photoresist film on the substrate W during the liquid immersion lithography process. Furthermore, the pre/post-exposure process module 600 may perform a process of cleaning the substrate W after the liquid immersion lithography process. In addition, in a case where a coating process is performed using chemical amplification resist, the pre/post-exposure process module 600 may perform a post-exposure bake process.

The pre/post-exposure process module 600 has the pre-processing module 601 and the post-processing module 602. The pre-processing module 601 performs a process of processing the substrate W before an exposure process, and the post-processing module 602 performs a process of processing the substrate W after the exposure process. The pre-processing module 601 and the post-processing module 602 are disposed on different floors so as to be divided from each other. According to an embodiment, the pre-processing module 601 is located over the post-processing module 602. The pre-processing module 601 is located at the same height as the coating module 401. The post-processing module 602 is located at the same height as the developing module 402. The pre-processing module 601 may include protective-film coating chambers 610, bake chambers 620, and a transfer chamber 630. The protective-film coating chambers 610, the transfer chamber 630, and the bake chambers 620 are sequentially disposed along the second direction 14. Accordingly, the protective-film coating chambers 610 and the bake chambers 620 are located to be spaced apart from each other in the second direction 14, with the transfer chamber 630 therebetween. The protective-film coating chambers 610 are vertically arranged along the third direction 16. Alternatively, the protective-film coating chambers 610 may be arranged in the first direction 12 and the third direction 16. The bake chambers 620 are vertically arranged along the third direction 16. Alternatively, the bake chambers 620 may be arranged in the first direction 12 and the third direction 16.

The transfer chamber 630 is located side by side with the first cooling chamber 530 of the second buffer module 500 in the first direction 12. A pre-processing robot 632 is located in the transfer chamber 630. The transfer chamber 630 has a substantially square or rectangular shape. The pre-processing robot 632 transfers the substrate W between the protective-film coating chambers 610, the bake chambers 620, the buffer 520 of the second buffer module 500, and a first buffer 720 of the interface module 700 that will be described below. The pre-processing robot 632 has a hand 633, an arm 634, and a support rod 635. The hand 633 is fixedly attached to the arm 634. The arm 634 has a retractable and rotatable structure. The arm 634 is coupled to the support rod 635 so as to be linearly movable along the support rod 635 in the third direction 16.

Each of the protective-film coating chambers 610 coats the substrate W with a protective film that protects a resist film during liquid immersion lithography. The protective-film coating chamber 610 has a housing 611, a support plate 612, and a nozzle 613. The housing 611 has a cup shape with an open top. The support plate 612 is located in the housing 611 and supports the substrate W. The support plate 612 is provided so as to be rotatable. The nozzle 613 dispenses a protective liquid for forming a protective film onto the substrate W placed on the support plate 612. The nozzle 613 may have a circular tubular shape and may dispense the protective liquid onto the center of the substrate W. Selectively, the nozzle 613 may have a length corresponding to the diameter of the substrate W, and a dispensing opening of the nozzle 613 may have a slit shape. In this case, the support plate 612 may be provided in a fixed state. The protective liquid contains a foam material. A material having a low affinity with photoresist and water may be used as the protective liquid. For example, the protective liquid may include a fluorine-based solvent. The protective-film coating chamber 610 dispenses the protective liquid onto the central area of the substrate W while rotating the substrate W placed on the support plate 612.

Each of the bake chambers 620 performs heat treatment on the substrate W coated with the protective film. The bake chamber 620 has a cooling plate 621 or a heating plate 622. The cooling plate 621 includes a cooling means 623 such as cooling water or a thermoelectric element. Furthermore, the heating plate 622 includes a heating means 624 such as a heating wire or a thermoelectric element. The heating plate 622 and the cooling plate 621 may each be provided in one bake chamber 620. Selectively, some of the bake chambers 620 may include only the heating plate 622, and the other bake chambers 620 may include only the cooling plate 621.

The post-processing module 620 has cleaning chambers 660, post-exposure bake chambers 670, and a transfer chamber 680. The cleaning chambers 660, the transfer chamber 680, and the post-exposure bake chambers 670 are sequentially disposed along the second direction 14. Accordingly, the cleaning chambers 660 and the post-exposure bake chambers 670 are located to be spaced apart from each other in the second direction 14, with the transfer chamber 680 therebetween. The cleaning chambers 660 may be vertically arranged along the third direction 16. Selectively, the cleaning chambers 660 may be arranged in the first direction 12 and the third direction 16. The post-exposure bake chambers 670 may be vertically arranged along the third direction 16. Alternatively, the post-exposure bake chambers 670 may be arranged in the first direction 12 and the third direction 16.

The transfer chamber 680, when viewed from above, is located side by side with the second cooling chamber 540 of the second buffer module 500 in the first direction 12. The transfer chamber 680 has a substantially square or rectangular shape. A post-processing robot 682 is located in the transfer chamber 680. The post-processing robot 682 transfers the substrate W between the cleaning chambers 660, the post-exposure bake chambers 670, the second cooling chamber 540 of the second buffer module 500, and a second buffer 730 of the interface module 700 that will be described below. The post-processing robot 682 provided in the post-processing module 602 may have the same structure as the pre-processing robot 632 provided in the pre-processing module 601.

Each of the cleaning chambers 660 performs a cleaning process on the substrate W after an exposure process. The cleaning chamber 660 has a housing 661, a support plate 662, and a nozzle 663. The housing 661 has a cup shape with an open top. The support plate 662 is located in the housing 661 and supports the substrate W. The support plate 662 is provided so as to be rotatable. The nozzle 663 dispenses a cleaning solution onto the substrate W placed on the support plate 662. Water such as deionized water may be used as the cleaning solution. The cleaning chamber 660 dispenses the cleaning solution onto the central area of the substrate W while rotating the substrate W placed on the support plate 662. Selectively, while the substrate W is rotated, the nozzle 663 may linearly move or swing from the central area of the substrate W to the edge area thereof.

Each of the post-exposure bake chambers 670 heats the substrate W, which is subjected to an exposure process, by using far ultraviolet rays. A post-exposure bake process heats the substrate W to amplify acid generated in photoresist by an exposure process, thereby completing a change in the property of the photoresist. The post-exposure bake chamber 670 has a heating plate 672. The heating plate 672 includes a heating means 674 such as a heating wire or a thermoelectric element. The post-exposure bake chamber 670 may further include a cooling plate 671 therein. The cooling plate 671 includes a cooling means 673 such as cooling water or a thermoelectric element. Selectively, a bake chamber having only the cooling plate 671 may be additionally provided.

As described above, the pre-processing module 601 and the post-processing module 602 are completely separated from each other in the pre/post-exposure process module 600. Furthermore, the transfer chamber 630 of the pre-processing module 601 and the transfer chamber 680 of the post-processing module 602 may have the same size and may completely cover each other when viewed from above. Moreover, the protective-film coating chamber 610 and the cleaning chamber 660 may have the same size and may completely cover each other when viewed from above. In addition, the bake chamber 620 and the post-exposure bake chamber 670 may have the same size and may completely cover each other when viewed from above.

The interface module 700 transfers the substrate W between the pre/post-exposure process module 600 and the exposure apparatus 900. The interface module 700 has a frame 710, the first buffer 720, the second buffer 730, and an interface robot 740. The first buffer 720, the second buffer 730, and the interface robot 740 are located in the frame 710. The first buffer 720 and the second buffer 730 are vertically spaced apart from each other by a predetermined distance. The first buffer 720 is disposed in a higher position than the second buffer 730. The first buffer 720 is located at the height corresponding to the pre-processing module 601, and the second buffer 730 is disposed at the height corresponding to the post-processing module 602. When viewed from above, the first buffer 720 is disposed in a row along the first direction 12 together with the transfer chamber 630 of the pre-processing module 601, and the second buffer 730 is disposed in a row along the first direction 12 together with the transfer chamber 680 of the post-processing module 602.

The interface robot 740 is located to be spaced apart from the first buffer 720 and the second buffer 730 in the second direction 14. The interface robot 740 transfers the substrate W between the first buffer 720, the second buffer 730, and the exposure apparatus 900. The interface robot 740 has a structure substantially similar to that of the second buffer robot 560.

The first buffer 720 temporarily stores the substrate W before the substrate W processed in the pre-processing module 601 is moved to the exposure apparatus 900. The second buffer 730 temporarily stores the substrate W before the substrate W processed in the exposure apparatus 900 is moved to the post-processing module 602. The first buffer 720 has a housing 721 and a plurality of supports 722. The supports 722 are disposed in the housing 721 and are spaced apart from each other along the third direction 16. One substrate W is placed on each of the supports 722. The housing 721 has openings (not illustrated) that face toward the interface robot 740 and the pre-processing robot 632, such that the interface robot 740 and the pre-processing robot 632 load the substrates W onto the supports 722 in the housing 721 or unload the substrates W from the supports 722 in the housing 721. The second buffer 730 has a structure substantially similar to that of the first buffer 720. However, the housing 731 of the second buffer 730 has no openings in the directions in which the interface robot 740 and the post-processing robot 682 are provided. The interface module 700 may include only the buffers and the robot as described above, without including a chamber for performing a predetermined process on a substrate.

Figure 5:
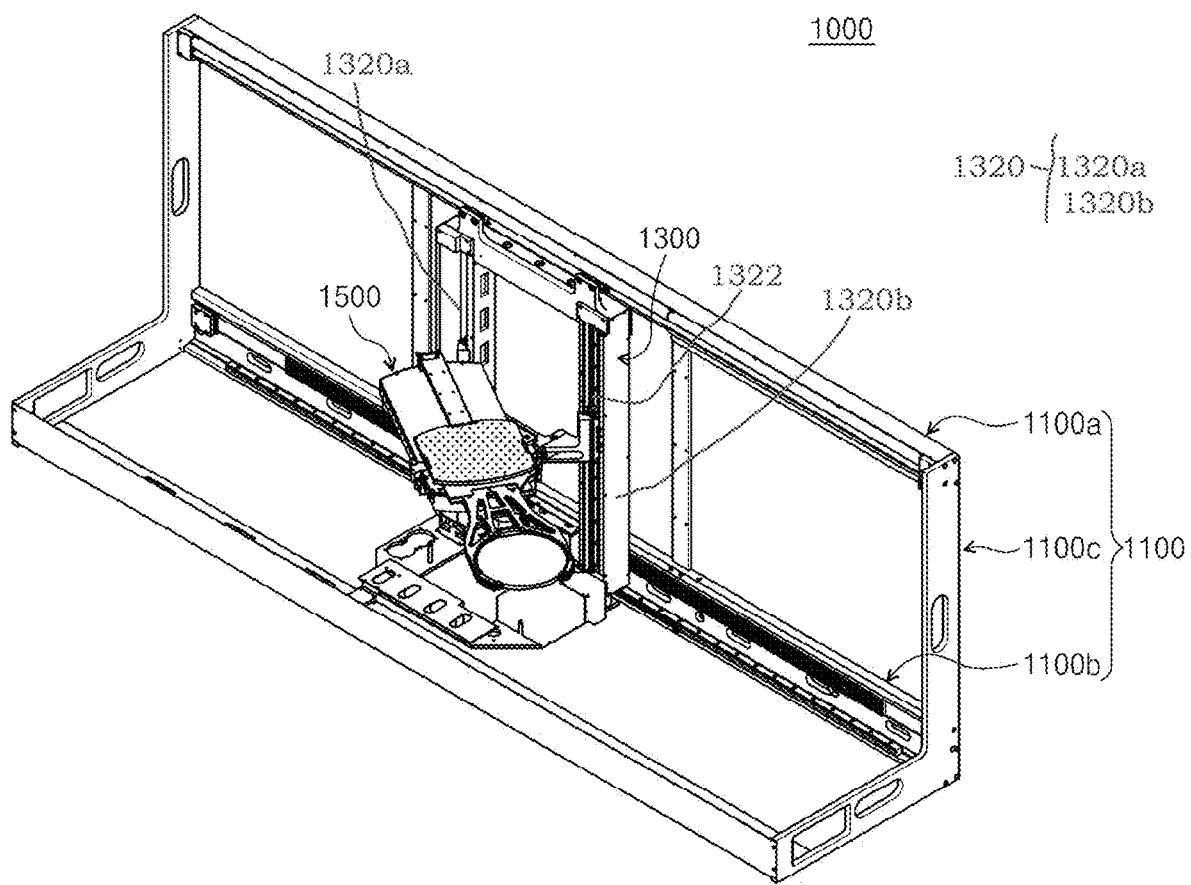
FIG. 5 is a perspective view illustrating a substrate transport apparatus of FIG. 1.

FIG. 5 is a perspective view illustrating the substrate transport apparatus of FIG. 1.

Referring to FIG. 5, the substrate transport apparatus 1000 includes a robot moving unit and a transport robot 1500. The robot moving unit may include a horizontal drive member 1100 and a vertical drive member 1300.

The horizontal drive member 1100 linearly moves the vertical drive member 1300 in a horizontal direction. For example, the vertical drive member 1300 may be moved in the first direction by the horizontal drive member 1100. The horizontal drive member 1100 has an upper horizontal frame 1100*a*, a lower horizontal frame 1100*b*, and a support frame 1100*c*. The upper horizontal frame 1100*a*, the lower horizontal frame 1100*b*, and the support frame 1100*c* are combined together to form a rectangular ring shape. The upper horizontal frame 1100*a* is located over the lower horizontal frame 1100*b* to face the lower horizontal frame 1100*b*. The upper horizontal frame 1100*a* and the lower horizontal frame 1100*b* have lengthwise directions parallel to each other. For example, the upper horizontal frame 1100*a* and the lower horizontal frame 1100*b* may have lengthwise directions parallel to the first direction. The support frame 1100*c* connects the upper horizontal frame 1100*a* and the lower horizontal frame 1100*b* such that the upper horizontal frame 1100*a* and the lower horizontal frame 1100*b* are fixed. The support frame 1100*c* has a lengthwise direction perpendicular to the upper horizontal frame 1100*a*. For example, the support frame 1100*c* may have a lengthwise direction parallel to the third direction. The support frame 1100*c* extends from opposite ends of each of the upper horizontal frame 1100*a* and the lower horizontal frame 1100*b*.

The vertical drive member 1300 guides a movement of the transport robot 1500 in the third direction. The vertical drive member 1300 includes a vertical frame 1320 and a drive member (not illustrated). The vertical frame 1320 is disposed such that the lengthwise direction thereof is parallel to the third direction. A plurality of vertical frames 1320 are provided to stably support the transport robot 1500. According to an embodiment, the vertical frames 1320 may include a first vertical frame 1320*a* and a second vertical frame 1320*b* that support opposite ends of a support 1520 of the transport robot 1500. Each of the first vertical frame 1320*a* and the second vertical frame 1320*b* is coupled to the upper horizontal frame 1100*a* at an upper end thereof and is coupled to the lower horizontal frame 1100*b* at a lower end thereof. The vertical frames 1320 are simultaneously moved along the lengthwise directions of the upper horizontal frame 1100*a* and the lower horizontal frame 1100*b*. Each of the vertical frames 1320 has a guide rail 1322 formed on one surface thereof. The guide rail 1322 has a lengthwise direction parallel to the third direction. The drive member (not illustrated) moves the transport robot 1500 in the lengthwise direction of the guide rail 1322. The drive member (not illustrated) is provided on the vertical frames 1320. For example, the drive member (not illustrated) may be implemented with a belt and pulleys.

The transport robot 1500 transports a substrate W.

Figure 6:
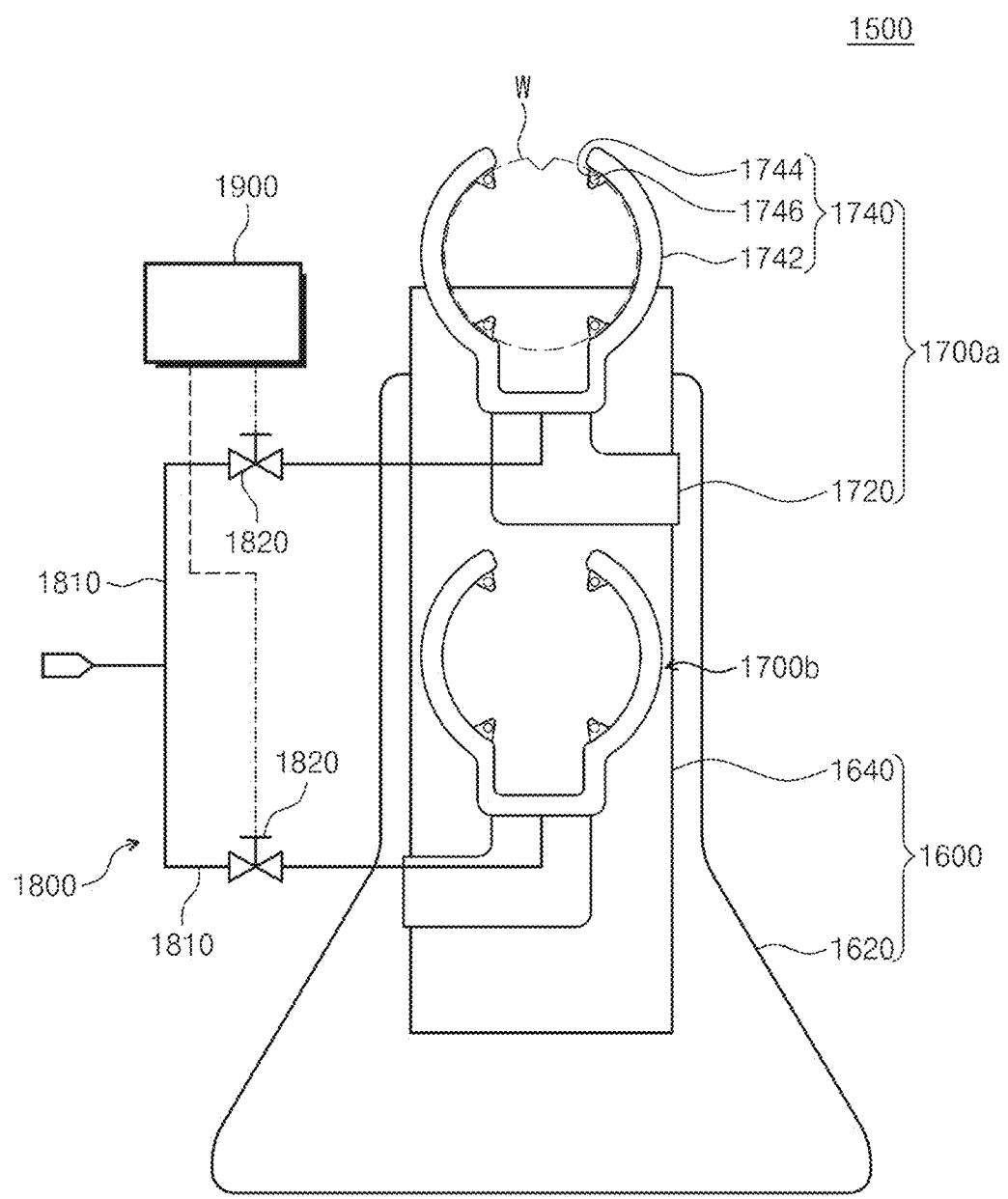
FIG. 6 is a plan view illustrating a transport robot of FIG. 5.
Figure 7:
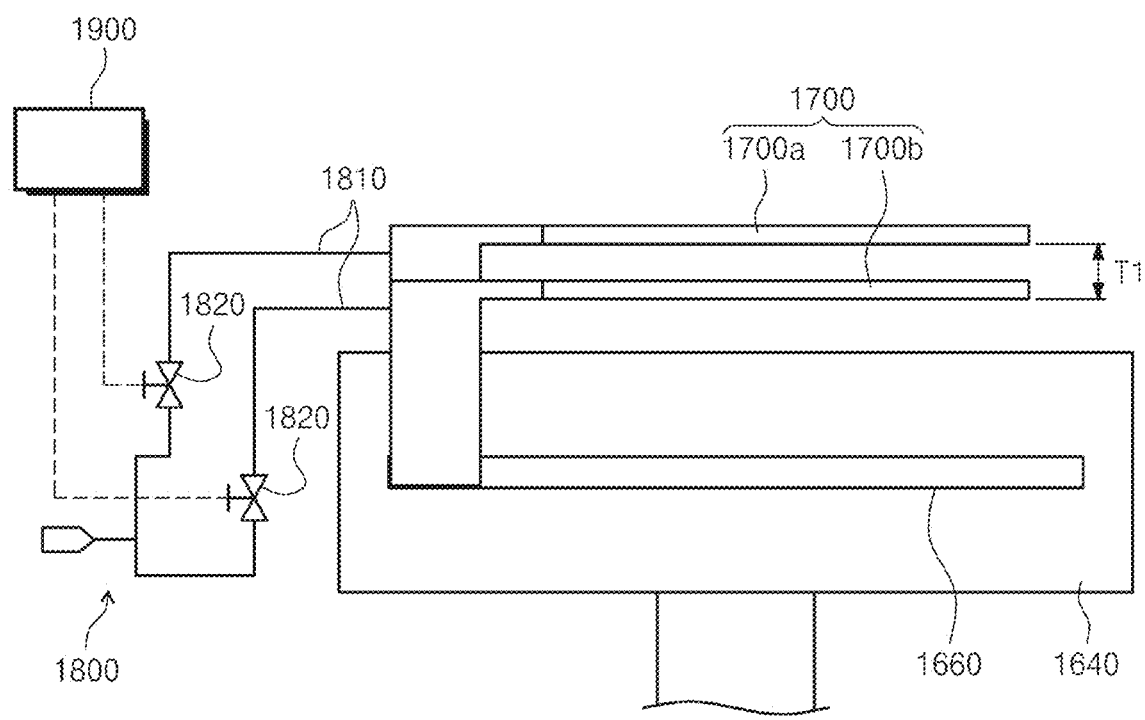
FIG. 7 is a sectional view illustrating the transport robot of FIG. 5.

FIG. 6 is a plan view illustrating the transport robot of FIG. 5, and FIG. 7 is a sectional view illustrating the transport robot of FIG. 5.

Referring to FIGS. 6 and 7, the transport robot 1500 includes a moving member 1600, hands 1700, a vacuum pressure supply unit 1800, and a controller 1900.

The moving member 1600 includes a support 1620, a body 1640, and a drive member (not illustrated). The support 1620 has a plate shape. Opposite lateral ends of the support 1620 are connected to the first vertical frame 1320*a* and the second vertical frame 1320*b*. The support 1620 is movable in the horizontal direction and the vertical direction by the robot moving unit.

The body 1640 is located on an upper surface of the support 1620. The body 1640 is coupled to the support 1620 so as to be rotatable about an axis thereof. For example, the body 1640 may rotate about the central axis facing the third direction relative to the support 1620. The body 1640 has a rectangular parallelepiped shape. The body 1640 has a horizontal lengthwise direction. The body 1640 has a plurality of guides 1660 formed on one surface and an opposite surface thereof. For example, the one surface and the opposite surface of the body 1640 on which the guides 1660 are formed may be side surfaces facing away from each other. Selectively, the guides 1660 may be formed on an upper surface of the body 1640. In this embodiment, the guides 1660 are described as being formed on the opposite side surfaces of the body 1640. As many guides 1660 as the hands 1700 are provided. Each of the guides 1660 has a lengthwise direction parallel to the lengthwise direction of the body 1640. The guides 1660 guide directions of movement of the hands 1700. The drive member (not illustrated) provides a driving force to move the hands 1700. Each of the hands 1700 is movable between a forward position and a home position by the drive member (not illustrated).

The hands 1700 support substrates W, respectively. The hands 1700 are installed on the guides 1660 and are movable forward or backward. The hands 1700 are located at different heights. The hands 1700 may include a first hand 1700*a* and a second hand 1700*b*. The first hand 1700*a* may be located over the second hand 1700*b*. The first hand 1700*a* and the second hand 1700*b* are disposed to have a difference of a first height T1 therebetween. In this embodiment, two hands 1700 are provided. However, the number of hands 1700 is not limited thereto, and one, or three or more hands 1700 may be provided.

Each of the first hand 1700*a* and the second hand 1700*b* includes an arm 1720, a base plate 1742, a seating plate 1744, and a suction pad 1746. The arm 1720 connects the base plate 1742 and the guide 1660. The arm 1720 extends from a rear end of the base plate 1742 and is connected to the guide 1660 located on one side of the body 1640. The arm 1720 has an inverted and reversed L shape when viewed from above.

The base plate 1742 has an annular ring shape that is open at one side. An opposite side of the base plate 1742 that is opposite the one side serves as the rear end of the base plate 1742 from which the arm 1720 extends. For example, the base plate 1742 may have the shape of "U". The base plate 1742 has an opening formed therein. The opening serves as an area where the substrate W is seated. The opening faces an up/down direction and is formed to be larger than the supported substrate W. According to an embodiment, the opening may have a radius of curvature larger than the radius of the substrate W. Accordingly, when the substrate W is seated on the hand 1700, the base plate 1742 surrounds the periphery of the substrate W. The lateral portion of the substrate W seated on the hand 1700 is located to be spaced apart from an inside surface of the base plate 1742.

A plurality of seating plates 1744 are provided. The seating plates 1744 extend from the inside surface of the base plate 1742 toward the center of the base plate 1742. The seating plates 1744 are located at the same height. The seating plates 1744 are located on different areas of the base plate 1742. For example, four seating plates 1744 may be provided. Selectively, three or fewer seating plates 1744 or five or more seating plates 1744 may be provided.

The substrate W is directly supported on the suction pad 1746. A plurality of suction pads 1746 are provided. The suction pads 1746 support different areas of the substrate W. As many suction pads 1746 as the seating plates 1744 may be provided. The suction pads 1746 are fixedly coupled to upper surfaces of the seating plates 1744. The suction pads 1746 have suction holes formed therein. The pressures in the suction holes are lowered by a pressure-reducing member. Accordingly, the substrate W supported on the suction pads 1746 is clamped to the hand 1700 by vacuum pressure. For example, the pressures in the suction holes may be reduced to a pressure lower than the atmospheric pressure. The pressures in the suction holes may be lower than −80 kPa. For example, the suction pads 1746 may be formed of a material containing PEEK or silicon (Si).

The vacuum pressure supply unit 1800 supplies vacuum pressures to the suction pads 1746 of each of the first hand 1700*a* and the second hand 1700*b*. The vacuum pressure supply unit 1800 may include vacuum pressure lines 1810 and opening/shutting valves 1820 disposed in-line with the vacuum pressure lines 1810 and operated by control signals of the controller 1900.

The controller 1900 controls the vacuum pressure supply unit 1800 to supply vacuum pressures to the first hand 1700*a* and the second hand 1700*b* or interrupt the supply of the vacuum pressures to the first hand 1700*a* and the second hand 1700*b*. The controller 1900 controls the opening/shutting valves 1820, which are in line-with the vacuum pressure lines 1810 connected to the first hand 1700*a* and the second hand 1700*b*, such that the vacuum pressures of the first hand 1700*a* and the second hand 1700*b* are turned off at the same height from a substrate support member (e.g., a spin head). When the first hand 1700*a* and the second hand 1700*b* located at different heights move downward to load substrates onto the substrate support member (e.g., lift pins or a spin head), the vacuum pressures of the first hand 1700*a* and the second hand 1700*b* are all turned off at the same height. Accordingly, the distances by which the first hand 1700*a* and the second hand 1700*b* move downward after the vacuum pressures are turned off may be equal to each other, and thus accuracy in seating the substrates by the first hand 1700*a* and the second hand 1700*b* may be uniformly controlled.

The substrates are placed on the substrate support member (e.g., a spin head or lift pins) in a state of being supported on the hands 1700. At this time, misalignment of the substrates placed on the hands 1700 is intensified with an increase in the distances by which the substrates are moved downward after the vacuum pressures of the hands 1700 are turned off. Accordingly, the inventive concept maximally delays turning off the vacuum pressures of the hands 1700 and applies the same vacuum pressure OFF time to the hands 1700, thereby minimizing misalignment of the substrates.

Meanwhile, delay time (reaction time or response time) exists when the opening/shutting valves 1820 operate in response to control signals of the controller 1900. For example, assuming that the delay time of the opening/shutting valves 1820 is 150 ms, it is preferable that time to turn off the vacuum pressures of the hands 1700 exceed the delay time based on when the substrates are placed on the substrate support member. If the vacuum pressure OFF time is set without regard to the delay time, a process accident in which the substrates are placed on the substrate support member before the vacuum pressures of the hands 1700 are interrupted may occur.

Figure 8:
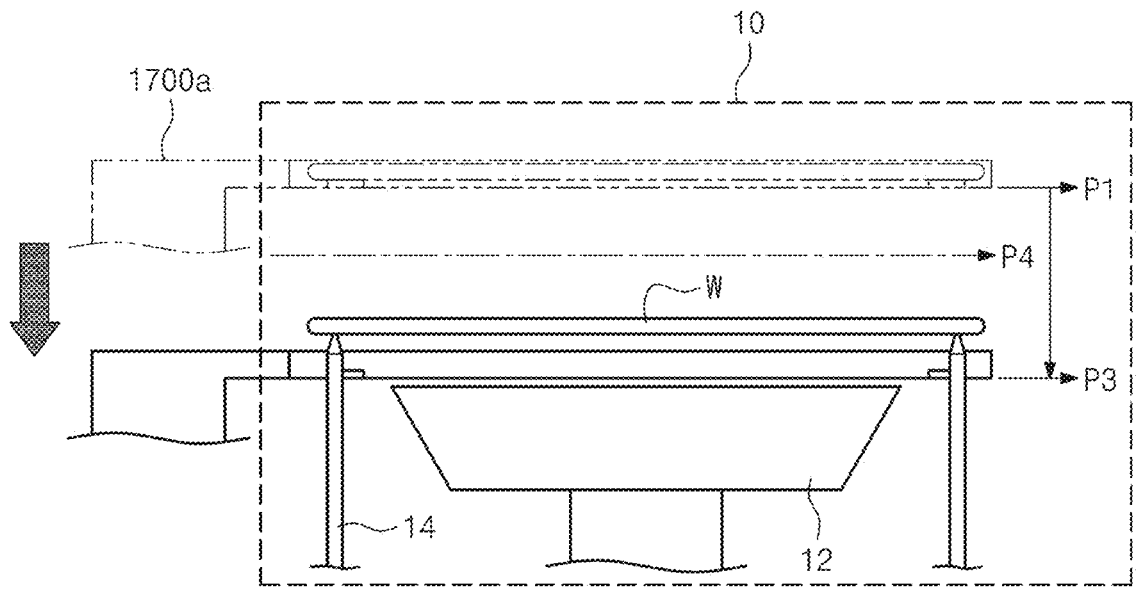
FIGS. 8 and 9 are views for explaining processes of transporting substrates by a first hand and a second hand.
Figure 9:
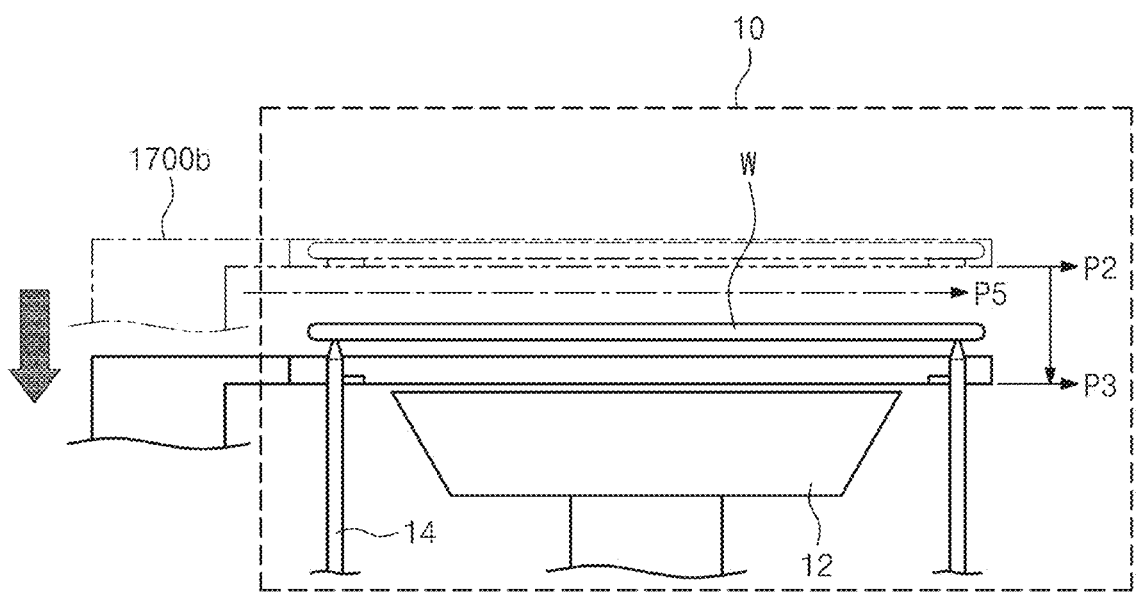

FIGS. 8 and 9 are views for explaining processes of transporting substrates by the first hand and the second hand. A process chamber 10 illustrated in FIGS. 8 and 9 may be a chamber in which an edge bead removal (EBR) process or an edge exposure of wafer (EEW) process is performed. However, without being limited thereto, the process chamber 10 may be one of various chambers (e.g., a coating chamber, a developing chamber, and the like) that process a single substrate placed on a support member. For example, the transport robot transports a substrate to the process chamber 10 by randomly selecting one of the first hand 1700*a* or the second hand 1700*b*.

Referring to FIG. 8, a substrate W is picked up by the first hand 1700*a* of the transport robot and is loaded into the process chamber 10 through a gate valve (not illustrated) that is formed in one sidewall of the process chamber 10. The first hand 1700*a* is moved above a spin head 12. At this time, the first hand 1700*a* is located at a first height P1 higher than upper ends of lift pins 14. To lower the substrate W onto the lift pins 14, the first hand 1700*a* is moved downward from the first height P1 to a third height P3 that is an unloading height. The third height P3 may be a height lower than the upper ends of the lift pins 14. The substrate W is placed on the lift pins 14 by the downward movement of the first hand 1700*a*. Meanwhile, the vacuum pressure by which the first hand 1700*a* clamps the substrate W may be turned off at a fourth height P4 before the substrate W is placed on the lift pins 14.

Referring to FIG. 9, a substrate W is picked up by the second hand 1700*b* of the transport robot and is loaded into the process chamber 10 through the gate valve (not illustrated) that is formed in the one sidewall of the process chamber 10. The second hand 1700*b* is moved above the spin head 12. At this time, the second hand 1700*b* is located at a second height P2 higher than the upper ends of the lift pins 14. The second height P2 is lower than the first height P1, and the height difference therebetween corresponds to the first height T1 illustrated in FIG. 7. To lower the substrate W onto the lift pins 14, the second hand 1700*b* is moved downward from the second height P2 to a third height P3 that is an unloading height. The third height P3 is equal to the third height P3 illustrated in FIG. 8.

The substrate W is placed on the lift pins 14 by the downward movement of the second hand 1700b. Meanwhile, the vacuum pressure by which the second hand 1700b clamps the substrate W may be turned off at a fifth height P5 before the substrate W is placed on the lift pins 14. At this time, the fourth height P4 of the first hand 1700a and the fifth height P5 of the second hand 1700b may be equal to each other.

Meanwhile, when the gap between the second hand 1700b located at the second height P2 and the lift pins 14 is narrow, the vacuum pressure by which the second hand 1700b clamps the substrate W may be turned off at the second height P2 right before the second hand 1700b is moved downward. At this time, the second height P2 may be equal to the fourth height P4 of the first hand 1700a.

Here, it is preferable that the height at which the vacuum pressures of the first hand 1700a and the second hand 1700b are interrupted be a height exceeding the delay time in operation of the opening/shutting valves based on when the substrates W are placed on the lift pins 14.

The substrates placed on the lift pins 14 may be loaded onto the spin head 12 by a pin down operation of the lift pins 14.

Figure 10:
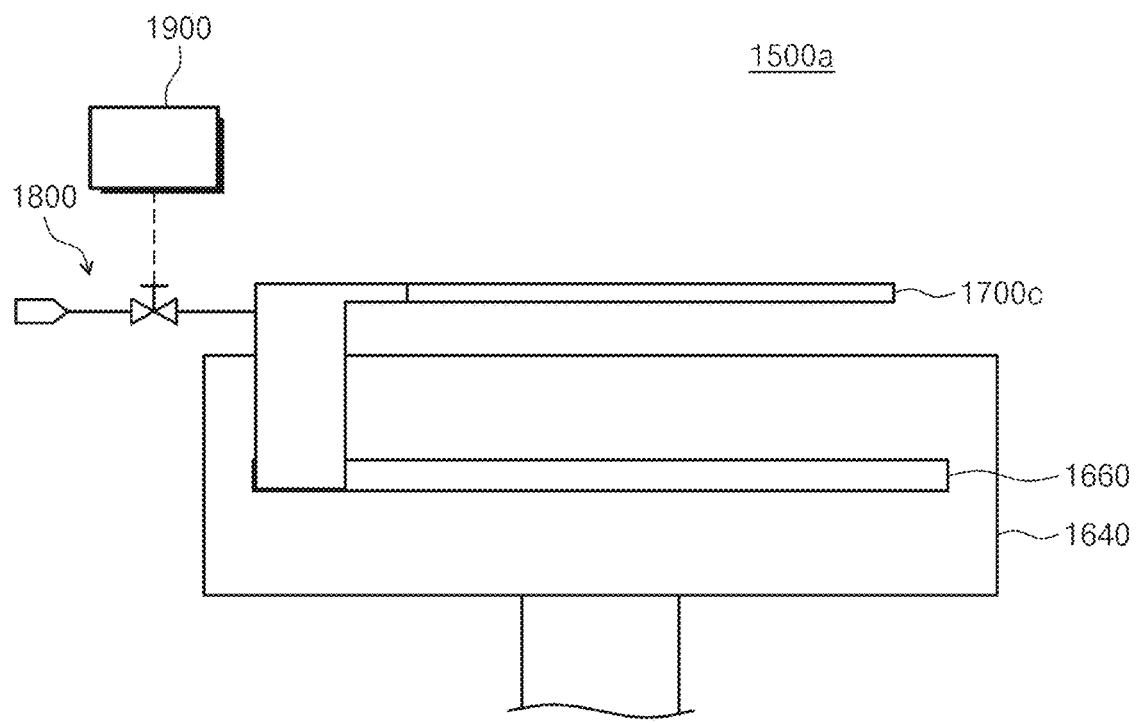
FIG. 10 is a view illustrating a modified example of the transport robot.
Figure 11:
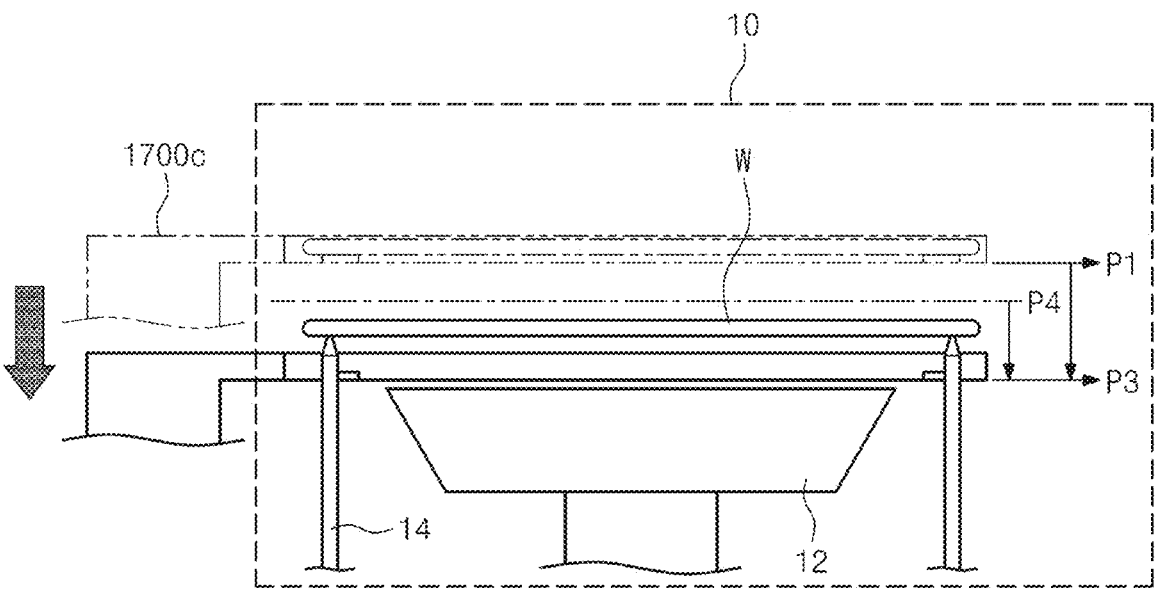
FIG. 11 is a view for explaining a process of transporting a substrate to a process chamber by a hand of a transport robot illustrated in FIG. 10.

FIG. 10 is a view illustrating a modified example of the transport robot, and FIG. 11 is a view for explaining a process of transporting a substrate to a process chamber by a hand 1700c of a transport robot 1500a illustrated in FIG. 10.

The transport robot 1500a illustrated in FIG. 10 has a configuration and a function substantially similar to those of the transport robot illustrated in FIGS. 5 to 7, and therefore the following description will be focused on the difference therebetween.

The transport robot 1500a of FIG. 10 differs from the transport robot of FIGS. 5 to 7 in that the transport robot 1500a has one hand 1700c.

Referring to FIG. 11, a substrate W is picked up by the hand 1700c of the transport robot 1500a and is loaded into the process chamber 10 through a gate valve formed in one sidewall of the process chamber 10. The hand 1700c is moved above a spin head 12. At this time, the hand 1700c is located at a first height P1 higher than upper ends of lift pins 14. To lower the substrate W onto the lift pins 14, the hand 1700c is moved downward from the first height P1 to a third height P3 that is an unloading height. The third height P3 may be a height lower than the upper ends of the lift pins 14. The substrate W is placed on the lift pins 14 by the downward movement of the hand 1700c. The vacuum pressure by which the hand 1700c clamps the substrate W may be turned off at a fourth height P4 before the substrate W is placed on the lift pins 14. As mentioned above, it is preferable that time to turn off the vacuum pressure of the hand 1700c exceed delay time based on when the substrate W is placed on the lift pins 14.

According to the embodiments of the inventive concept, the vacuum pressure by which the transport hand clamps the substrate may be turned off while the transport hand moves downward to lower the substrate onto the support member. Accordingly, accuracy in seating the substrate may be improved.

According to the embodiments of the inventive concept, when the transport hands located at different heights move downward to load the substrates onto the support member, the vacuum pressures by which the transport hands clamp the substrates may be turned off at the same height from the support member such that distances by which the transport hands move downward after the vacuum pressures are turned off are equal to each other. Accordingly, accuracy in seating the substrates may be improved.

Effects of the inventive concept are not limited to the aforementioned effects, and any other effects not mentioned herein may be clearly understood from this specification and the accompanying drawings by those skilled in the art to which the inventive concept pertains.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate transport apparatus comprising:
   a transport hand configured to clamp a substrate by vacuum pressure;
   a vacuum pressure supply unit configured to supply the vacuum pressure to the transport hand; and
   a controller configured to control the vacuum pressure supply unit to supply the vacuum pressure to the transport hand or interrupt the supply of the vacuum pressure to the transport hand, wherein
   wherein the controller is configured to interrupt the supply of the vacuum pressure while the transport hand moves downward to load the substrate onto a substrate support member in a state of being located over the substrate support member,
   wherein the vacuum pressure supply unit includes a vacuum pressure line and an opening/shutting valve,
   the opening/shutting valve is in-line with the vacuum pressure line,
   the controller is configured to operate the opening/shutting valve such that, in response to receiving a control signal from the controller, the opening/shutting valve opens or shuts following a delay time after receiving the control signal from the controller,
   the controller is configured to delay interrupting the supply of vacuum pressure to the transport hand by a time period when the transport hand moves downward to load the substrate onto the substrate support member in the state of being located over the substrate support member, and
   the time period is greater than the delay time.

2. The substrate transport apparatus of claim 1, wherein the time period is less than a total time for the transport hand to lower the substrate onto the substrate support member such that controller is configured to interrupt the vacuum pressure to the transport hand when the transport hand is above the substrate support member and spaced apart from the substrate support member.

3. A substrate transport apparatus comprising:

transport hands configured to clamp substrates by vacuum pressures, respectively, and located at different heights;

a vacuum pressure supply unit configured to supply the vacuum pressures to the transport hands;

a controller configured to control the vacuum pressure supply unit to supply the vacuum pressures to the transport hands or interrupt the supply of the vacuum pressures to the transport hands, wherein the controller controls the vacuum pressure supply unit such that the vacuum pressures of the transport hands are turned off at the same height from a substrate support member, wherein the vacuum pressure supply unit includes vacuum pressure lines and opening/shutting valves, the opening/shutting valves are in-line with the vacuum pressure lines and operated by control signals of the controller, and wherein periods of time during which the transport hands move downward after the vacuum pressures are turned off exceed delay time in operation of the opening/shutting valves based on when the substrates are placed on the substrate support member.

4. The substrate transport apparatus of claim 3, wherein distances by which the transport hands move after the vacuum pressures are turned off are equal to each other.

5. A substrate processing apparatus comprising:

a process chamber having a substrate support member on which a substrate is placed; and a substrate transport apparatus configured to load the substrate onto the substrate support member, wherein the substrate transport apparatus includes transport hands configured to clamp substrates by vacuum pressures, respectively, and located at different heights, and wherein the vacuum pressures of the transport hands are turned off at the same height from the substrate support member, wherein the substrate transport apparatus further includes a vacuum pressure supply unit and a controller, the vacuum pressure supply unit is configured to supply the vacuum pressures to the transport hands, the controller is configured to control the vacuum pressure supply unit to supply the vacuum pressures to the transport hands or interrupt the supply of the vacuum pressures to the transport hands, and wherein the vacuum pressure supply unit includes opening/shutting valves in-line with vacuum pressure lines connected to the transport hands, the opening/shutting valves are operated by control signals of the controller, and periods of time during which the transport hands move downward after vacuum pressures are turned off exceed delay time in operation of the opening/shutting valves based on when the substrates are placed on the substrate support member.

6. The substrate processing apparatus of claim 5, wherein the controller controls the vacuum pressure supply unit such that the vacuum pressures of the transport hands are turned off at a height where distances by which the transport hands move downward after the vacuum pressures are turned off are equal to each other.

7. The substrate processing apparatus of claim 5, wherein an edge bead removal (EBR) process is performed in the process chamber.

8. The substrate processing apparatus of claim 5, wherein an edge exposure of wafer (EEW) process is performed in the process chamber.

9. The substrate processing apparatus of claim 5, wherein the substrate support member includes:

a spin chuck; and a lift pin configured to receive the substrate from each of the transport hands and lower the substrate onto the spin chuck.

* * * * *